(12) United States Patent
Yang et al.

(10) Patent No.: US 12,550,648 B2
(45) Date of Patent: Feb. 10, 2026

(54) PLASMA-ASSISTED ETCHING OF METAL OXIDES

(71) Applicant: Taiwan Semiconductor Manufacturing Co., Ltd., Hsinchu (TW)

(72) Inventors: Chansyun David Yang, Shinchu (TW); Keh-Jeng Chang, Hsinchu (TW); Chan-Lon Yang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/447,943

(22) Filed: Aug. 10, 2023

(65) Prior Publication Data

US 2023/0386854 A1   Nov. 30, 2023

Related U.S. Application Data

(62) Division of application No. 17/699,314, filed on Mar. 21, 2022, which is a division of application No. 16/944,653, filed on Jul. 31, 2020, now Pat. No. 11,282,711.

(51) Int. Cl.
*H01L 21/311* (2006.01)
*H01J 37/32* (2006.01)
*H01L 21/02* (2006.01)
*H01L 21/67* (2006.01)
*H01L 21/683* (2006.01)

(52) U.S. Cl.
CPC .. *H01L 21/31122* (2013.01); *H01J 37/32357* (2013.01); *H01J 37/32422* (2013.01); *H01J 37/3244* (2013.01); *H01J 37/32623* (2013.01); *H01J 37/32724* (2013.01); *H01L 21/0206* (2013.01); *H01L 21/67069* (2013.01); *H01L 21/67103* (2013.01); *H01L 21/6831* (2013.01); *H01J 2237/006* (2013.01); *H01J 2237/334* (2013.01); *H01J 2237/335* (2013.01)

(58) Field of Classification Search
None
See application file for complete search history.

(56) References Cited

U.S. PATENT DOCUMENTS

| | | | |
|---|---|---|---|
| 8,563,424 | B2 | 10/2013 | Ganguli et al. |
| 10,229,837 | B2 | 3/2019 | Fischer et al. |
| 10,256,108 | B2 | 4/2019 | Fischer et al. |
| 11,276,604 | B1 | 3/2022 | Yang et al. |
| 11,282,711 | B2 | 3/2022 | Yang et al. |
| 2013/0081761 | A1 | 4/2013 | Sawada |

(Continued)

OTHER PUBLICATIONS

Merriam-Webster Dictionary definition of "filter" retrieved from https://merriam-webster.com/dictionary/filter on Jun. 8, 2023.

(Continued)

*Primary Examiner* — Roberts P Culbert
(74) *Attorney, Agent, or Firm* — Sterne, Kessler, Goldstein Fox P.L.L.C.

(57) ABSTRACT

The present disclosure describes methods and systems for plasma-assisted etching of a metal oxide. The method includes modifying a surface of the metal oxide with a first gas, removing a top portion of the metal oxide by a ligand exchange reaction, and cleaning the surface of the metal oxide with a second gas.

20 Claims, 9 Drawing Sheets

(56) References Cited

U.S. PATENT DOCUMENTS

| | | | |
|---|---|---|---|
| 2014/0099795 A1 | 4/2014 | Tobin et al. | |
| 2014/0227881 A1 | 8/2014 | Lubomirsky et al. | |
| 2015/0170879 A1 | 6/2015 | Nguyen et al. | |
| 2016/0013020 A1 | 1/2016 | Ashtiani et al. | |
| 2016/0293431 A1 | 10/2016 | Sriraman et al. | |
| 2017/0186634 A1 | 6/2017 | Yanagisawa et al. | |
| 2017/0200586 A1 | 7/2017 | Treadwell et al. | |
| 2017/0200587 A1 | 7/2017 | Godet et al. | |
| 2017/0229311 A1* | 8/2017 | Tan | H01J 37/32926 |
| 2017/0256416 A1* | 9/2017 | Fischer | H01L 21/30655 |
| 2017/0338119 A1 | 11/2017 | Zhang et al. | |
| 2017/0365444 A1 | 12/2017 | Kim et al. | |
| 2018/0080124 A1 | 3/2018 | Bajaj et al. | |
| 2018/0096821 A1 | 4/2018 | Lubomirsky | |
| 2019/0157105 A1 | 5/2019 | Fischer et al. | |
| 2022/0216064 A1 | 7/2022 | Yang et al. | |

OTHER PUBLICATIONS

European Search Report and Annex for EP Application No. 21188794.8, European Patent Office, Netherlands, mailed on Jan. 18, 2022, 3 pages.

* cited by examiner

PLASMA-ASSISTED ETCHING OF METAL OXIDES

CROSS-REFERENCE TO RELATED APPLICATION

This application is a divisional application of U.S. patent application Ser. No. 17/699,314, filed on Mar. 21, 2022, titled "Plasma-Assisted Etching of Metal Oxides," which is a divisional application of U.S. patent application Ser. No. 16/944,653, filed on Jul. 31, 2020, titled "Plasma-Assisted Etching of Metal Oxides," the disclosures of which are incorporated herein by reference in their entireties.

BACKGROUND

Dry etching is a semiconductor manufacturing process that removes a masked pattern of material by exposing the material to a bombardment of ions. Before etching, a wafer is coated with photoresist or a hard mask (e.g., oxide or nitride) and exposed to a circuit pattern during a photolithography operation. Etching removes material from the pattern traces. This sequence of patterning and etching can be repeated multiple times during the semiconductor manufacturing process.

BRIEF DESCRIPTION OF THE DRAWINGS

Aspects of the present disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
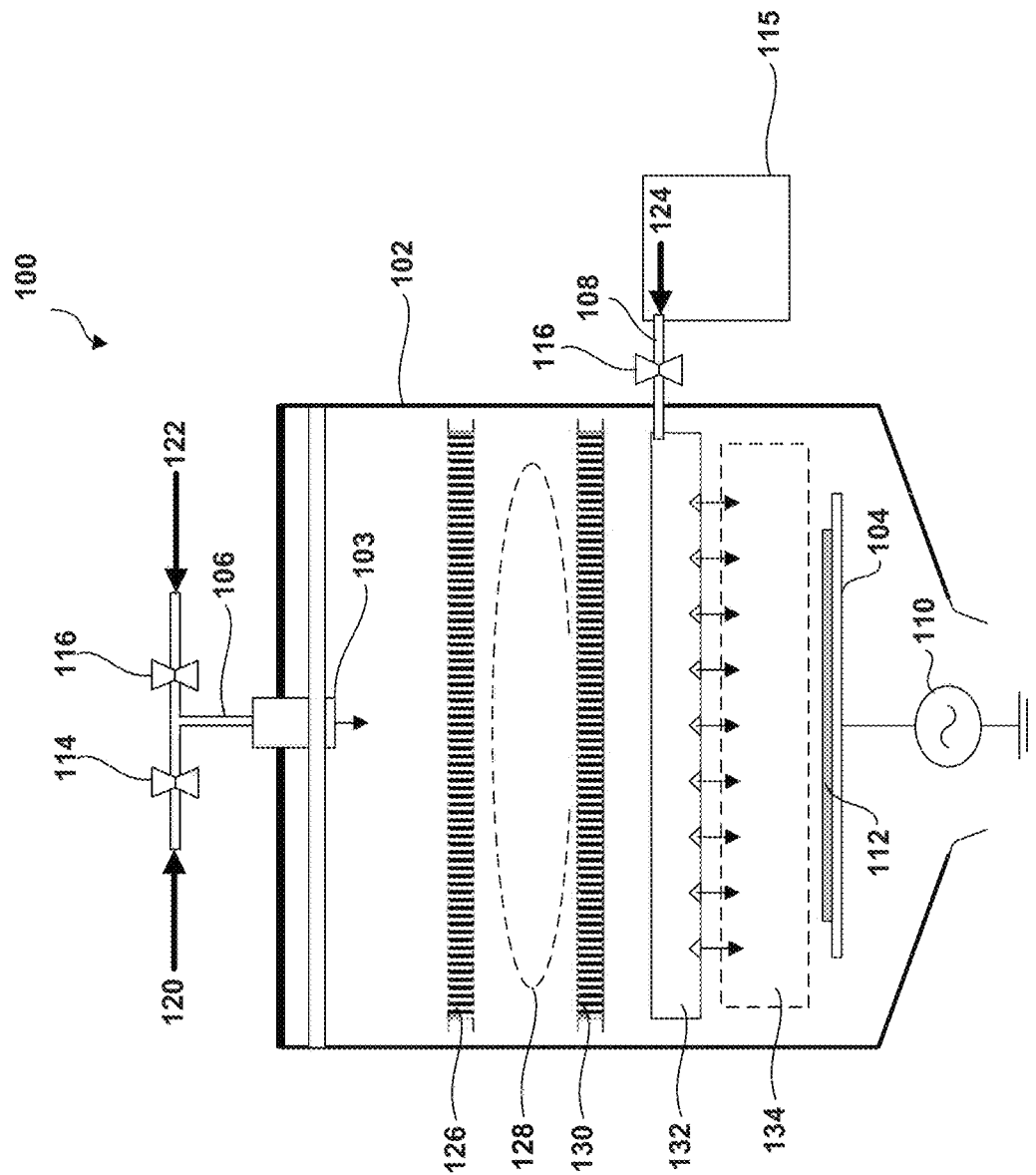
FIG. 1 illustrates a cross-sectional view of an exemplary plasma-assisted thermal atomic layer etching (ALE) system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Dry etching is a frequently used process in semiconductor manufacturing. Before etching, a wafer is coated with a photoresist or a hard mask (e.g., oxide or nitride) and a circuit pattern is transferred on the photoresist or the hard mask using photolithographic processes (e.g., photo exposure, post exposure bake, develop, hard bake, etc.). Etching is subsequently used to remove material from the surface of the wafer that is not covered by the patterned photoresist or hard mask. This sequence of patterning and etching can be repeated multiple times during chip manufacturing.

Plasma etching is performed by applying electromagnetic energy (e.g., radio frequency (RF)) to a gas that contains a chemically reactive element, such as nitrogen trifluoride and hydrogen, to form a plasma. The plasma releases positively charged ions that can bombard the surface of a wafer to remove, or etch, material. At the same time, chemically reactive radicals (e.g., atoms or groups of atoms with unpaired electrons) can react with the surface of the wafer to modify surface properties. To improve etch throughput, higher etch rates (e.g., several Å/min or nm/min) are desirable.

Process chemistries can differ depending on the types of films to be etched. For example, etch chemistries used in dielectric etch applications can be fluorine-based. Silicon and metal etch applications can use chlorine-based chemistries. An etch step may include etching one or more film layers from the surface of a wafer. When multiple layers are on the surface of the wafer, for example during the removal of a metal oxide, the etch process is required to remove the metal oxide but preserve other layers (e.g., Si, silicon oxide, silicon nitride, etc.), the selectivity of the etch process becomes an important parameter. Selectivity of an etch chemistry or an etch process can be defined as the ratio of two etch rates:the rate for the layer to be removed to the rate for the layer to be preserved. In an etch process, high selectivity ratios (e.g., greater than 10:1) are desirable. The ions in the plasma etching can have higher kinetic energies than the radicals. As such, the ions can have a higher etch rate than the radicals. However, the ions can have a lower etch selectivity than the radicals. The term "etch selectivity" can refer to the ratio of the etch rates of two different materials under the same etching conditions. Higher etch rate with higher etch selectivity is an objective in an etch process.

In an ideal case, the etch rate of an etch chemistry is the same (uniform) at all points/locations on a wafer, or within a die on a wafer. For example, in such an ideal case, the etch chemistry can etch the same structure (e.g., remove a metal oxide) across the wafer the same way, or etch different structures (e.g. remove one or more structures of a metal oxide), within a die the same way. The degree to which the etch rate of an etch chemistry varies at different points/locations on the wafer, or within a die on a wafer, is known as non-uniformity. Improving uniformity is another objective in an etch process.

Various embodiments of the present disclosure provide an exemplary plasma-assisted thermal atomic layer etching (ALE) process. In some embodiments, the plasma-assisted thermal ALE process can increase an etch rate of a metal oxide layer on a wafer while maintaining etch selectivity between the metal oxide and adjacent materials on the wafer. The metal oxide can include hafnium oxide, aluminum oxide, zirconium oxide, and other suitable metal oxide dielectric materials.

Atomic layer etching, or ALE, is a technique that can remove thin layers of material from the surface of a wafer using sequential reaction cycles (e.g., duty cycles); for example, during the removal of a metal oxide on one or more dielectric layers. The sequential reaction cycles of an ALE process can be "quasi self-limiting." In some embodiments, quasi self-limiting reactions may refer to those reactions that slow down as a function of time (e.g., asymptotically), or as a function of species dosage. A plasma-assisted thermal ALE process can include three sequential reaction cycles: (i) a surface modification cycle, (ii) a material removal cycle, and (iii) a surface cleaning cycle. The surface modification cycle can form a reactive surface layer with a defined thickness from a material on the surface of a wafer that has been exposed to the surface modification process. The modified material layer (reactive surface layer) can be subsequently removed during the next cycle (e.g., material removal cycle). Any unmodified material, which is not exposed to the surface modification chemistry during the surface modification cycle, will not be removed. The modified material, for example, can have a gradient in chemical composition and/or physical structure. The material removal cycle can remove the modified material layer while keeping the unmodified material(s) or layers intact. The total amount of material removed can be controlled by the number of repeated cycles (e.g., surface modification cycle, material removal cycle, and surface cleaning cycle). The surface cleaning cycle can remove surface residues and byproducts from the material removal cycle on the surface of the wafer and reset the surface to a near-pristine state for the next etching cycle.

In some embodiments, a time elapsed between sequential cycles (e.g., between the surface modification cycle and the material removal cycle) is referred to as a "transition time." During the transition time, reactants/byproducts from a current cycle are removed away from the surface of the wafer, prior to the release of new reactants. Prompt delivery of reactants into the chamber can reduce the transition time between cycles and the cycle duration (cycle time).

The plasma assisted thermal ALE technique can be used in a variety of etching schemes including, but not limited to, directional or isotropic etching (e.g., formation of air spacers) and selective or nonselective etching (e.g., removal of dielectric layers from an exposed surface). In a plasma assisted thermal ALE process the reactants can be, for example, delivered by one or more gases, a plasma, a vapor, or other suitable sources.

In some embodiments, the plasma-assisted thermal ALE process can modify the surface of the metal oxide layer with radicals from a plasma during the surface modification cycle. The material removal cycle can include a ligand exchange reaction, which can be performed under a thermal condition. In some embodiments, radicals of a plasma can increase the ligand exchange kinetic energy and the speed of the ligand exchange reaction, thus increasing removal of the modified surface of the metal oxide layer and the etching rate of the metal oxide layer. In some embodiments, one or more plates with evenly distributed holes or openings can distribute the gases and plasmas uniformly across the wafer. In some embodiments, a plasma flush of radicals during the surface cleaning cycle can remove surface ligand residues and byproducts and create a fresh surface for the next etching cycle. The plasma flush can further increase the etching rate of the plasma-assisted thermal ALE process.

FIG. 1 illustrates a cross-sectional view of an exemplary plasma-assisted thermal atomic layer etching (ALE) system 100, in accordance with some embodiments. By way of example and not limitation, plasma-assisted thermal ALE system 100 can include a chamber 102, a shower head 103 and a wafer holder 104 in chamber 102, a first gas line 106 and a second gas line 108 connected to chamber 102, and a plasma generator 110 connected to wafer holder 104. In some embodiments, an inner surface of chamber 102 can be covered with yttrium oxide ($Y_2O_3$) to protect chamber 102 from the plasmas and etch chemistries in the plasma-assisted ALE process. Shower head 103 can connect to first gas line 106 and release gases from first gas line 106 into chamber 102. A pressure in chamber 102 can range from about 3 mTorr to about 4 Torr. In the surface modification cycle, the pressure in chamber 102 can range from about 1 Torr to about 4 Torr. If the pressure is less than about 1 Torr, a ratio of the ions to the radicals in the plasma can be too high to cause surface damage. If the pressure is greater than about 4 Torr, the plasma may not be formed to assist the thermal ALE process. In the material removal cycle, the pressure in chamber 102 can range from about 3 mTorr to about 1000 mTorr. If the pressure is less than about 3 mTorr, a ratio of the ions to the radicals in the plasma can be too high to cause surface damage, and the ligand exchange precursors may be decomposed. If the pressure is greater than about 1000 mTorr, the ligand exchange precursors may be condensed. In the surface cleaning cycle, the pressure in chamber 102 can range from about 20 mTorr to about 200 mTorr. If the pressure is less than about 20 mTorr, a ratio of the ions to the radicals in the plasma can be too high to cause surface damage. If the pressure is greater than about 1000 mTorr, the plasma may not be formed to assist the thermal ALE process.

Wafer holder 104 can be an electrostatic wafer chuck and configured to hold a wafer 112. Wafer 112 can be patterned and have areas of a metal oxide layer on a surface of wafer 112 exposed for etching. In some embodiments, the metal oxide layer can include hafnium oxide, aluminum oxide, zirconium oxide, and other suitable metal oxide dielectric materials. Wafer holder 104 can include a heater (not shown) to heat wafer 112. In some embodiments, wafer 112 can be heated to a temperature ranging from about 150° C. to about 350° C. for the plasma-assisted thermal ALE process. If the temperature is less than about 150° C., the ligand exchange reaction may not be performed and the metal oxide layer may not be removed. If the temperature is greater than about 350° C., the plasma-assisted thermal ALE process may have no etch selectivity between the metal oxide layer and adjacent structures and cause surface damage. In some embodiments, plasma generator 110 can connect to wafer holder 104, apply a radio frequency (RF) signal to wafer holder 104, and generate a plasma in chamber 102.

First gas line 106 can include a first valve 114 controlling a gas flow of first gas 120 and a second valve 116 controlling a gas flow of second gas 122. In some embodiments, first gas 120 and second gas 122 can be delivered from a gas cabinet (not shown). In some embodiments, first gas 120 can include one or more surface modification gases, such as hydrogen fluoride (HF) and nitrogen trifluoride ($NF_3$). Second gas 122 can include a surface cleaning gas, such as hydrogen and argon. In some embodiments, first gas 120 can include a plasma of the surface modification gases and second gas 122 can include a plasma of the surface cleaning gas. A remote plasma generator (not shown) can generate the plasma of the surface modification gases and the plasma of the surface cleaning gas. First gas line 106 can direct the plasma of the surface modification gases and the plasma of the surface cleaning gas to shower head 103 in chamber 102. In some embodiments, second gas 122 can include a cleaning gas (e.g., helium) for a transition cycle after each cycle of the plasma-assisted thermal ALE process to pump and purge chamber 102 to prevent intermixing of gases and plasmas. In some embodiments, the transition cycle can last from about 30 s to about 60 s.

Second gas line 108 can include a third valve 118 controlling a gas flow of a vapor 124 flowing from a vaporizer 115 into chamber 102. Vaporizer 115 can convert a ligand exchange precursor from liquid to vapor 124, which can be drawn to chamber 102 by the vacuum in chamber 102. In some embodiments, a flow rate of vapor 124 can range from about 50 sccm to about 900 sccm. If the flow rate of vapor 124 is less than about 50 sccm, the modified surface may not be fully removed. If the flow rate of vapor 124 is greater than about 900 sccm, ligand residues may form on the surface of wafer 112.

Plasma-assisted thermal ALE system 100 can further include a first plate 126, a second plate 130, and a third plate 132 in chamber 102. In some embodiments, first plate 126 can have evenly distributed openings or concentric openings to uniformly distribute first gas 120 and second gas 122 delivered into chamber 102. Plasma region 128 can be formed between first plate 126 and second plate 130 by plasma generator 110. When first valve 114 is open and first gas 120 is delivered to chamber 102, plasma region 128 can include ions and radicals of first gas 120. When second valve 116 is open and second gas 122 is delivered to chamber 102, plasma region 128 can include ions and radicals of second gas 122. In some embodiments, second plate 130 can have evenly distributed openings or concentric openings similar to first plate 126. In some embodiments, second plate 130 can be electrically connected to an external power supply (not shown), such as a direct current (DC) power supply that keeps second plate 130 at a negative bias voltage ranging from about −1 Volt to about −500 Volts, to filter out ions. Radicals in plasma region 128 can pass through second plate 130. In some embodiments, second plate 130 can be electrically connected to a ground acting as a discharger for the ions. Second plate 130 can neutralize ions and form radicals with higher kinetic energies than radicals generated in plasma region 128. In some embodiments, third plate 132 can connect to second gas line 108 and have evenly distributed openings or nozzles on the side of third plate 132 facing wafer 112. Third plate 132 can generate uniformly distributed vapor 124 of ligand exchange precursor in gas region 134 around the surface of wafer 112. Uniformly distributed vapor of ligand exchange precursor in gas region 134 can improve the uniformity of the ligand exchange reaction on the surface of wafer 112 and the uniformity of etching profiles across wafer 112.

Figure 2:
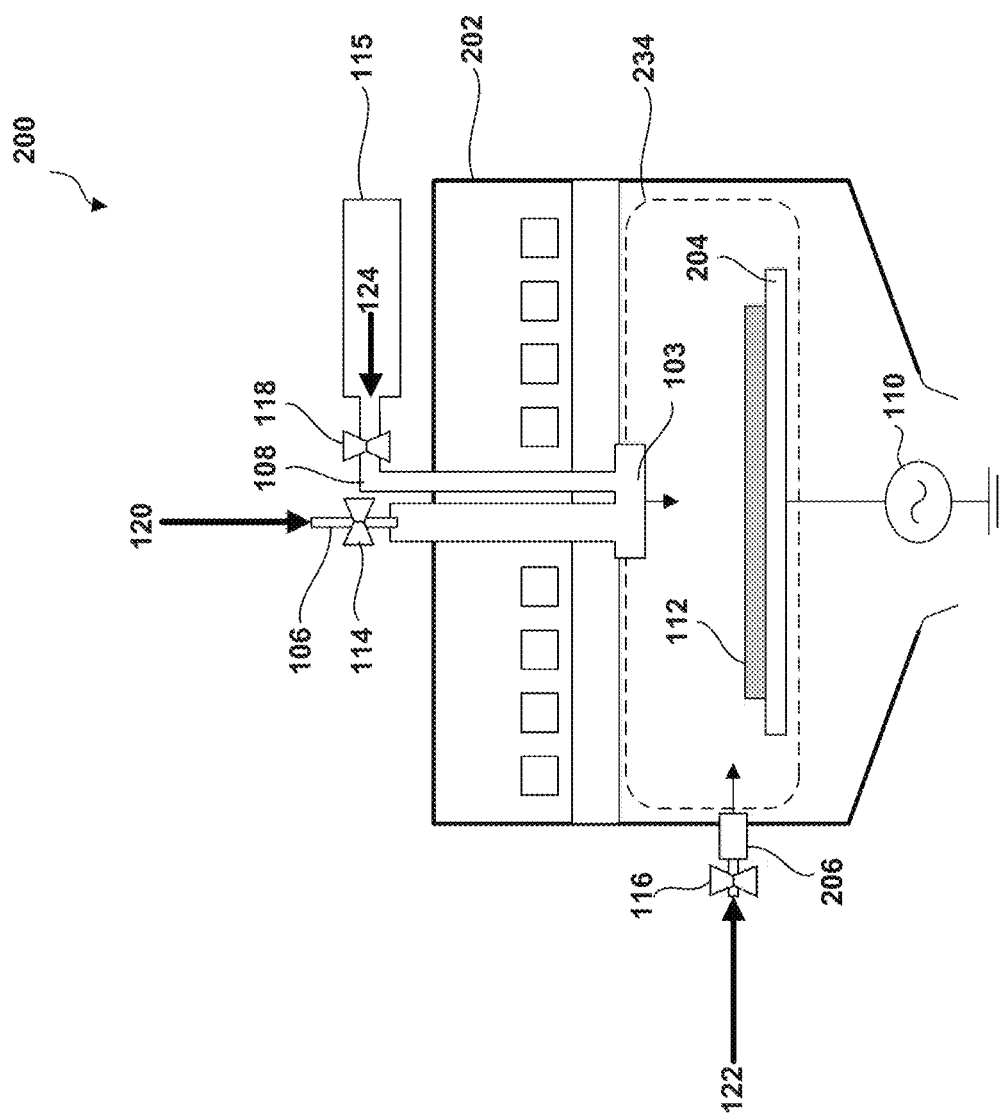
FIG. 2 illustrates a cross-sectional view of another exemplary plasma-assisted thermal ALE system, in accordance with some embodiments.

FIG. 2 illustrates a cross-sectional view of another exemplary plasma-assisted thermal ALE system 200, in accordance with some embodiments. As shown in FIG. 2, plasma-assisted thermal ALE system 200 can include a chamber 202, shower head 103 and wafer holder 204 in chamber 202, plasma generator 110 connected to wafer holder 204, first gas line 106, second gas line 108, and third gas line 206. Elements in FIG. 2 with the same annotations as elements in FIG. 1 are described above. A pressure in chamber 202 can range from about 1 mTorr to about 500 mTorr. Wafer holder 204 can be an electrostatic wafer chuck and configured to hold and heat wafer 112, similar to wafer holder 104.

Third gas line 206 can include second valve 116 controlling a gas flow of second gas 122. Different from plasma-assisted thermal ALE system 100, plasma-assisted thermal ALE system 200 can deliver second gas 122 to wafer 112 using third gas line 206 separate from first gas 120 (e.g., on sidewalls of chamber 202). In some embodiments, without a gas distribution plate, third gas line 206 can improve process control of distributing second gas 122 uniformly on wafer 112 and can improve surface cleaning after the material removal cycle.

Gas region 234 can include a plasma of first gas 120 during the surface modification cycle, vapor 124 of ligand exchange precursor during the material removal cycle, and a plasma of second gas 122 during the surface cleaning cycle, according to some embodiments. Plasma generator 110 can generate a plasma of first gas 120 and a plasma of second gas 122 in gas region 234 during the plasma-assisted thermal ALE process. Vapor 124 of ligand exchange precursor can be delivered to gas region 234 by second gas line 108. In some embodiments, comparing plasma-assisted thermal ALE systems 100 and 200, plasma-assisted thermal ALE system 100 can have plasmas and precursors more uniformly distributed in gas region 134 with first plate 126, second plate 130, and third plate 132, while ALE system 200 can have an easier design.

Figures 3A, 3B:
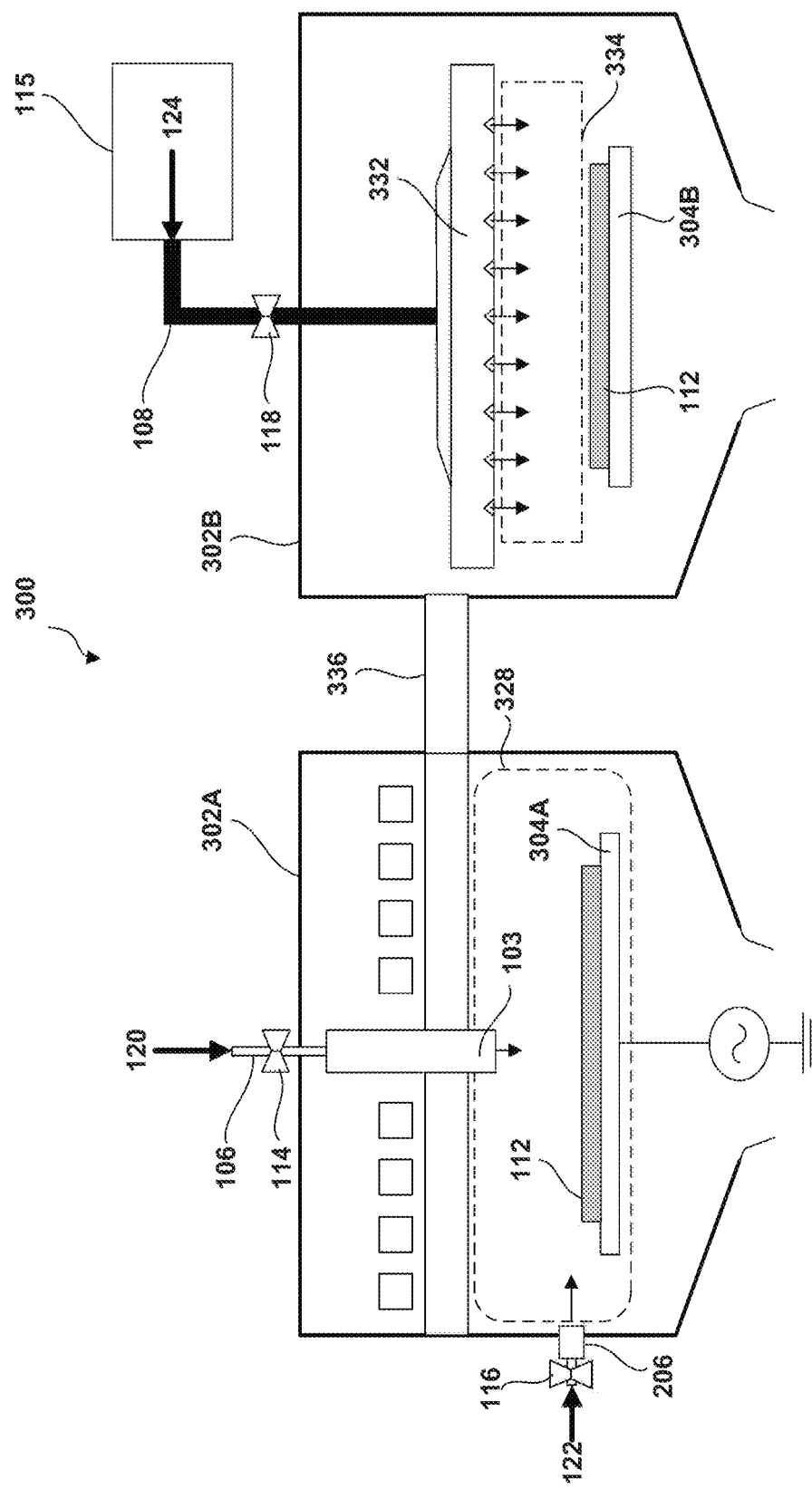
FIGS. 3A and 3B illustrate cross-sectional views of an exemplary plasma-assisted thermal ALE system with two chambers, in accordance with some embodiments.

FIGS. 3A and 3B illustrate cross-sectional views of an exemplary plasma-assisted thermal ALE system 300 with chamber 302A and chamber 302B, in accordance with some embodiments. As shown in FIGS. 3A and 3B, plasma-assisted thermal ALE system 300 can include chamber 302A, shower head 103 and a wafer holder 304A in chamber 302A, plasma generator 110 connected to wafer holder 304A, first gas line 106 and third gas line 206 connected to shower head 103. Plasma-assisted thermal ALE system 300 can further include chamber 302B, a wafer holder 304B in chamber 302B, second gas line 108 connected to chamber 302B. Chamber 302A and chamber 302B can be connected by connector 336, which can be configured to connect chamber 302A and 302B and transfer wafer 112 between chamber 302A and chamber 302B without breaking a vacuum. Elements in FIGS. 3A and 3B with the same annotations as elements in FIGS. 1 and 2 are described above. The pressures in chamber 302A and 302B can range from about 1 mTorr to about 500 mTorr. Wafer holders 304A and 304B can be electrostatic wafer chucks and configured to hold and heat wafer 112, similar to wafer holder 104.

According to some embodiments, the plasma-assisted thermal ALE process can have the surface modification cycle and the cleaning cycle in chamber 302A and the material removal cycle in chamber 302B. As shown in FIGS. 3A and 3B, plasma generator 110 in chamber 302A can generate a plasma of first gas 120 in plasma region 328 during the surface modification cycle. After the surface modification cycle, wafer 112 can be transferred to chamber 302B through connector 336. Vapor 124 of the ligand exchange precursor can be delivered to chamber 302B via second gas line 108. A plate 332 can be connected to second gas line 108 and can have evenly distributed openings or nozzles similar to third plate 132 on the side facing wafer 112. Plate 332 can distribute vapor 124 uniformly in gas region 334 around wafer 112 to improve the uniformity of the ligand exchange reaction on the surface of wafer 112. After the material removal cycle, wafer 112 can be transferred back to chamber 302A through connector 336 for the surface cleaning cycle. Plasma generator 110 in chamber 302A can generate a plasma of second gas 122 in plasma region 328 and clean the surfaces of the metal oxide layer on wafer 112 with the plasma. Comparing plasma-assisted thermal ALE systems 100 and 300, plasma-assisted thermal ALE system 100 can have plasma-enhanced ligand exchange reaction during the material removal cycle. As ALE system 300 can have separate chambers 302A and 302B for plasmas and ligand exchange precursors respectively, ALE system 300 may not need transition cycles after each cycle of the plasma-assisted thermal ALE process, which can reduce process time and improve process control.

Figure 4B:
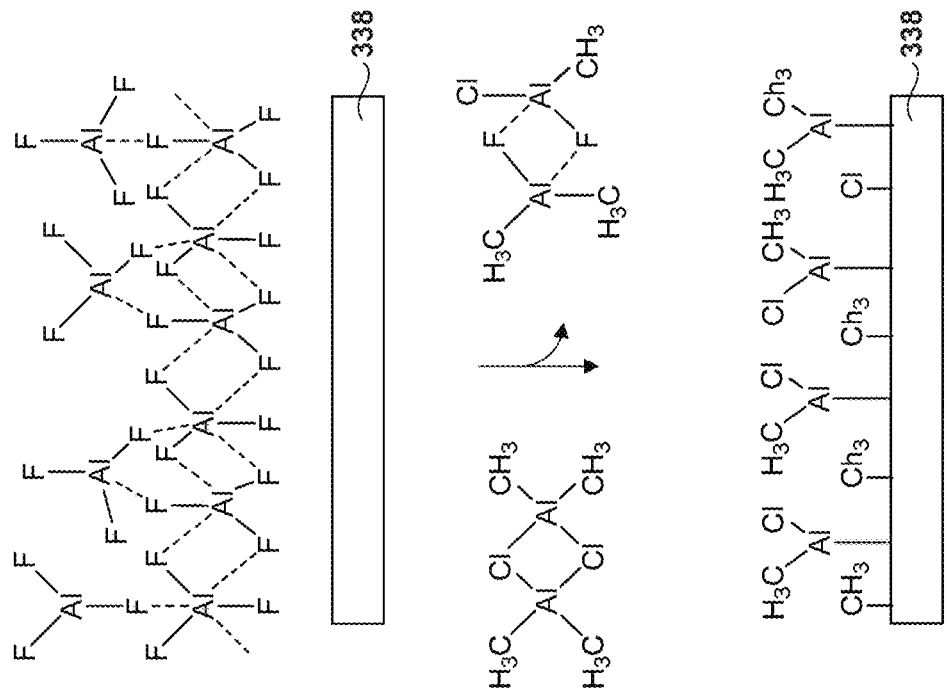
FIGS. 4A and 4B illustrate a surface modification cycle and a ligand exchange cycle respectively of an exemplary plasma-assisted thermal ALE process, in accordance with some embodiments.
Figure 4A:
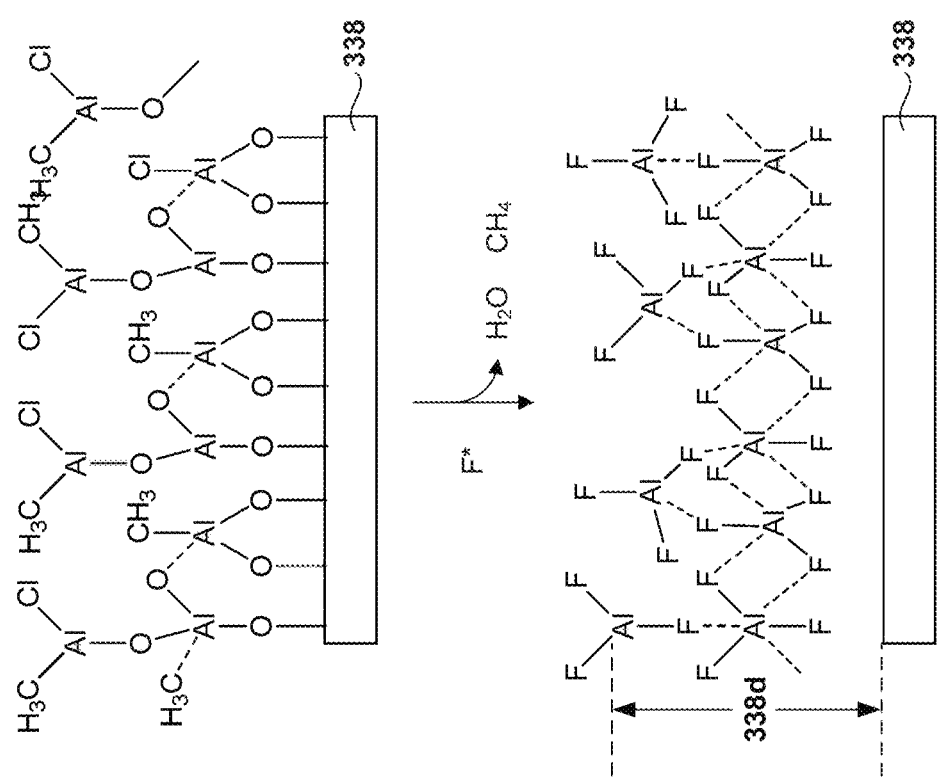

FIGS. 4A and 4B illustrate a surface modification cycle and a ligand exchange cycle respectively of an exemplary plasma-assisted thermal ALE process, in accordance with some embodiments. By way of example and not limitation, a surface of a metal oxide layer 338 can be fluorinated by fluorine radicals generated from the plasma of first gas 120 by plasma generator 110, as shown in FIG. 4A. In some embodiments, metal oxide layer 338 can include aluminum oxide and first gas 120 can include $NF_3$. In some embodiments, the plasma of first gas 120 can be generated at a pressure ranging from about 1 Torr to about 4 Torr with a power ranging from about 400 W to about 700 W. The gas flow rate of first gas 120 can range from about 100 sccm to about 500 sccm. A temperature of the plasma process can range from about 250° C. to about 300° C. A time of the surface modification cycle can range from about 10 s to about 30 s and a depth 338$d$ of fluorinated metal oxide on the surface of metal oxide layer 338 can range from about 3 Å to about 10 Å after the surface modification cycle. If depth 338$d$ is less than about 3 Å, the surface of metal oxide layer 338 may not be fully fluorinated for the ligand exchange reaction. If depth 338$d$ is greater than about 10 Å, ligand residues may be formed after the ligand exchange reaction. During the surface modification cycle, water vapor ($H_2O$) and/or methane ($CH_4$) can be formed and removed by the vacuum in the plasma-assisted thermal ALE system.

The surface modification cycle can be followed by the material removal cycle, as shown in FIG. 4B. By way of example and not limitation, a ligand exchange precursor for aluminum oxide can include diethylaluminium chloride ($C_4H_{10}AlCl$ or DMAC) and react with the fluorinated surface of metal oxide layer 338. The fluorinated metal oxide can be removed from metal oxide layer 338 and ligand residues and byproducts can remain on the surface of metal oxide layer 338. In some embodiments, the ligand exchange reaction can be performed at a temperature ranging from about 250° C. to about 300° C. In some embodiments, the ligand exchange reaction can be accelerated by higher energy radicals generated by third plate 132 from the plasma of second gas 122 (shown in FIG. 1). The plasma of second gas 122 can be generated by plasma generator 110 at a pressure ranging from about 100 mTorr to about 1000 mTorr with a power ranging from about 250 W to about 400 W. In some embodiments, plasma generator 110 can use pulsing power with a duty cycle ranging from about 10% to about 70%, which means the power of plasma generator 110 can be on for about 10% to about 70% of the time during the material removal cycle. The gas flow rate of second gas 122 can range from about 1000 sccm to about 5000 sccm. In some embodiments, second gas 122 can include hydrogen or argon to provide higher energy radicals for the ligand exchange reaction. In some embodiments, the flow rate of vapor 124 of ligand exchange precursor can range from about 50 sccm to about 900 sccm. The time to remove the fluorinated surface of metal oxide layer 338 can range from about 10 s to about 50 s. After the material removal cycle, the fluorinated metal oxide on the surface of metal oxide layer 338 can be removed and a thickness of the removed metal oxide can range from about 3 A to about 10 A, the same as depth 338$d$.

The material removal cycle can be followed by surface cleaning cycle in the plasma-assisted thermal ALE process (not shown). By way of example and not limitation, second gas 122 can include a surface cleaning gas, such as hydrogen. Plasma generator 110 can generate a plasma of the surface cleaning gas. Radicals of the plasma of second gas 122 can clean the surface of metal oxide layer 338, remove about 90% to about 100% of the ligand exchange residues and byproducts, and reset the surface to a condition with substantially no residue for the next etching cycle. In some embodiments, additional surface cleaning may be needed to remove the ligand exchange residues and byproducts on the surface. In some embodiments, the plasma of second gas 122 can be generated at a pressure ranging from about 20 mTorr to about 200 mTorr with a power ranging from about 100 W to about 400 W. The gas flow rate of second gas 122 can range from about 100 sccm to about 1000 sccm. A temperature of the plasma process can range from about 250° C. to about 300° C. A time of the surface cleaning cycle can range from about 10 s to about 30 s. If the time is less than about 10 s, ligand residues and byproducts may not be fully removed from the surface of metal oxide layer 338. The ligand residues and byproducts can block surface fluorination of the surface modification cycle. If the time is greater than about 30 s, exposed areas of other materials (e.g., silicon oxide, silicon nitride, silicon, etc.) may be damaged.

Figure 5:
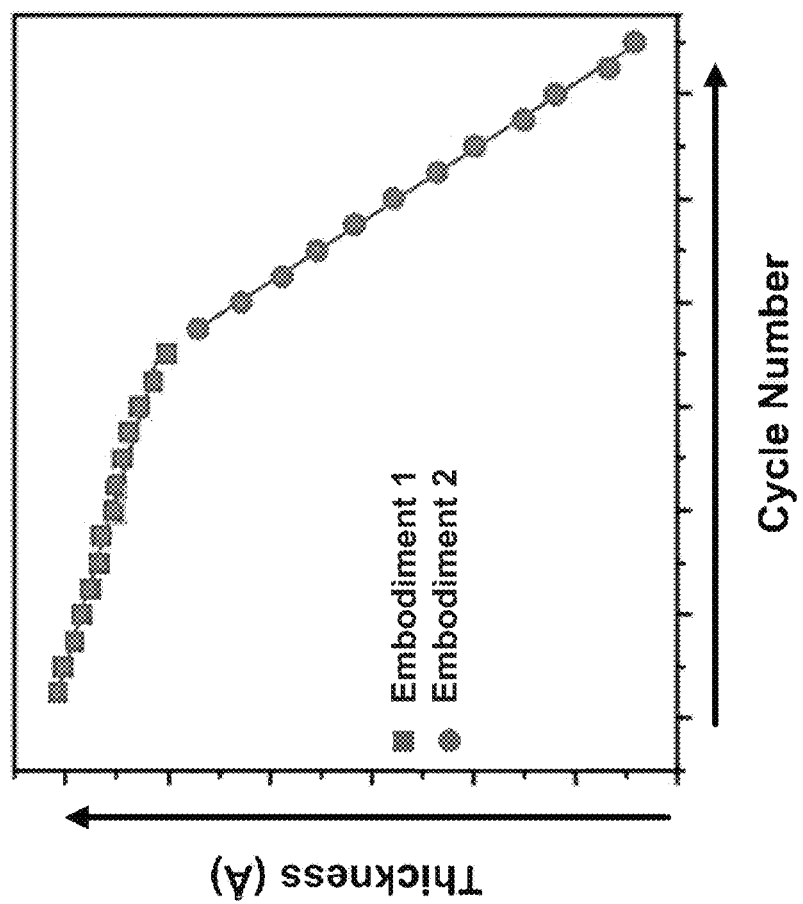
FIG. 5 illustrates a thickness of a metal oxide layer changing with regard to cycle numbers for an exemplary thermal ALE process, in accordance with some embodiments.

FIG. 5 illustrates a thickness of a metal oxide layer changing with regard to cycle numbers for an exemplary thermal ALE process, in accordance with some embodiments. Embodiment 1 can include surface modification cycles and material removal cycles without plasma assistance, and embodiment 2 can include surface modification cycles, material removal cycles, and surface cleaning cycles with plasma assistance. A slope of the thickness with regard to the cycle numbers for each embodiment represented respective etching rate of the metal oxide layer. As shown in FIG. 5, embodiment 2 can have a higher etching rate than embodiment 1 because of the surface cleaning cycle and plasma assistance. In some embodiments, an etching rate of embodiment 1 can range from about 0.1 A/cycle to about 0.5 A/cycle. In some embodiments, an etching rate of embodiment 2 can range from about 5 A/cycle to about 10 A/cycle. In some embodiments, a ratio of the etching rate of embodiment 1 to embodiment 2 can range from about 10 to about 100.

Figure 6B:
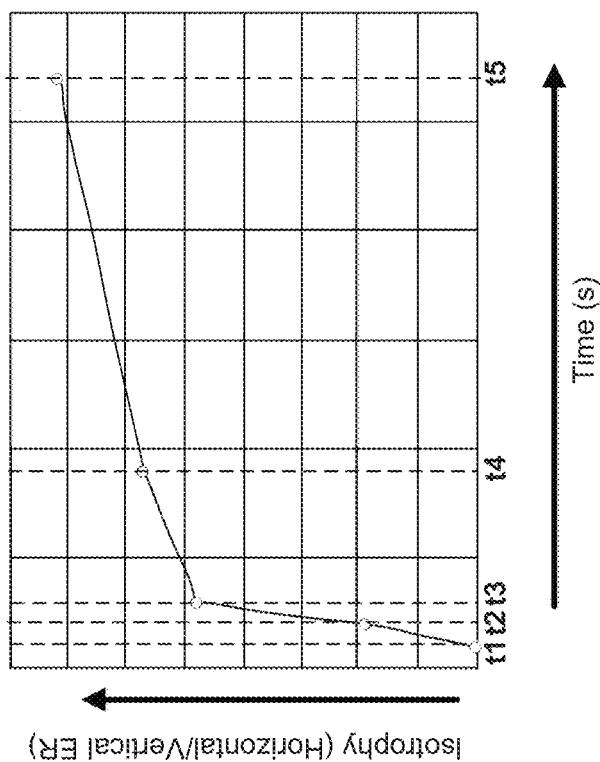
FIGS. 6A and 6B illustrate vertical and horizontal etching rates and a ratio of the vertical etching rate to the horizontal etching rate with respect to time of an exemplary plasma-assisted thermal ALE process, in accordance with some embodiments.
Figure 6A:
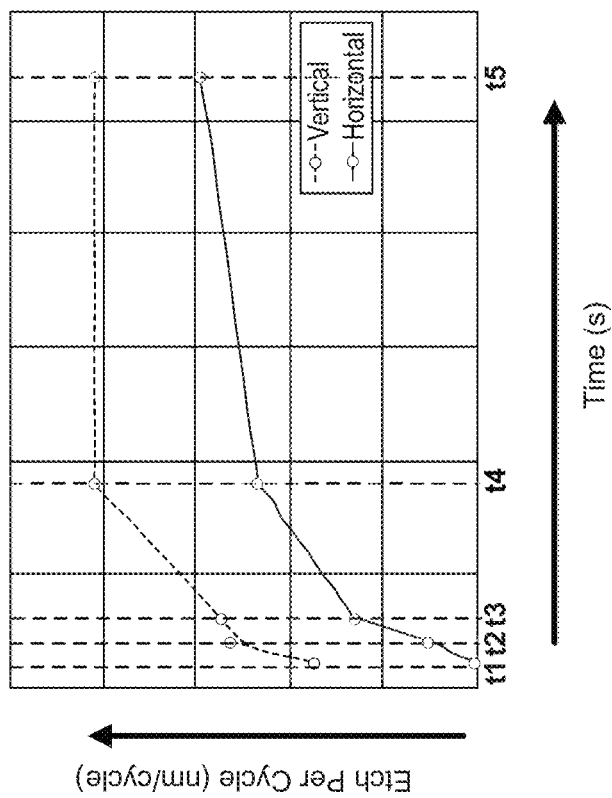

FIGS. 6A and 6B illustrate vertical and horizontal etching rates and a ratio of the vertical etching rate to the horizontal etching rate with respect to time of an exemplary plasma-assisted thermal ALE process, in accordance with some embodiments. As shown in FIGS. 6A and 6B, the plasma-assisted thermal ALE process can have a vertical etching rate higher than a horizontal etching rate. The vertical etching rate can saturate with the increase of etching time while the horizontal etching rate can gradually increase with the increase of etching time. As a result, a ratio of the horizontal etching rate to the vertical etching rate (also referred to as "isotropy factor") can increase with the etching time. For example, as shown in FIGS. 6A and 6B, vertical etching rate is higher than horizontal etching rate at t1, t2, and t3. Vertical etching rate can saturate at t4 and t5 while horizontal etching rate can still increase. The change of the ratio of horizontal etching rate to vertical etching rate with time can affect the etching profile of the metal oxide layer. For example, if a vertical profile is desired, such as removing a sacrificial metal oxide layer and forming an air spacer, the etching time per etching cycle can be controlled shorter than t3. If a horizontal etching is desired, such as removing a gate dielectric layer of a metal oxide, the etching time per etching cycle can be controlled longer than t5.

Figure 7:
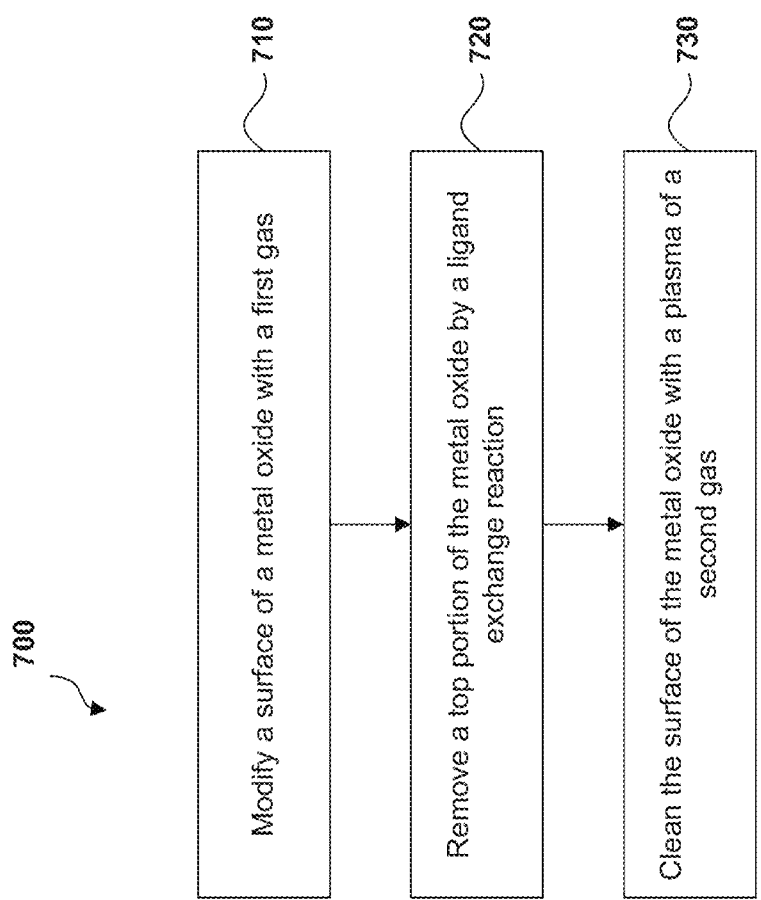
FIG. 7 illustrates a method of plasma-assisted thermal ALE of a metal oxide, in accordance with some embodiments.

FIG. 7 illustrates a flow diagram of method 700 for plasma-assisted thermal ALE of a metal oxide, in accordance with some embodiments. Additional operations may be performed between various operations of method 700 and may be omitted merely for clarity and ease of description. Additional operations can be provided before, during, and/or after method 700; one or more of these additional processes are briefly described herein. Therefore, method 700 may not be limited to the operations described below.

Method 700 can be performed by exemplary plasma-assisted thermal ALE systems 100, 200, and 300 shown in FIGS. 1, 2, and 3A and 3B. For illustrative purposes, the operations in FIG. 7 will be described with reference to exemplary plasma-assisted thermal ALE system 100 shown in FIG. 1 and the exemplary plasma-assisted thermal ALE process in FIGS. 4A and 4B. As shown in FIG. 1, plasma-assisted thermal ALE system 100 can include first gas line 106 to deliver first gas 120 and second gas 122 to chamber 102 and second gas line 108 to deliver vapor 124 to chamber 102. Shower head 103 can release gases from first gas line 106 to chamber 102. Wafer holder 104 can hold and heat wafer 112 having metal oxide layer 338 on the surface exposed for etching. Plasma generator 110 can generate plasmas from first gas 120 and second gas 122.

Referring to FIG. 7, method 700 begins with operation 710 and the process of modifying a surface of a metal oxide with a first gas. As shown in FIG. 1, first valve 114 can open and first gas 120 can be delivered to chamber 102. In some embodiments, first gas 120 can include one or more surface modification gases, such as HF and $NF_3$. In some embodiments, first gas 120 can include a plasma of the one or more surface modification gases generated from a remote plasma generator (not shown). First plate 126 can have evenly distributed openings or concentric openings to uniformly distribute first gas 120 over wafer 112. Plasma generator 110 can generate a plasma of first gas 120 and form plasma region 128 between first plate 126 and second plate 130. Plasma region 128 can include ions and radicals of the plasma of first gas 120. In some embodiments, second plate 130 can be biased at a negative voltage ranging from about −1 Volt to about −500 Volts to filter out ions. Radicals in plasma region 128 can pass through second plate 130 and reach the surface of metal oxide layer 338 on wafer 112.

In some embodiments, surface modification refers to a process where the radicals of first gas 120 (e.g., $NF_3$) interacts with the exposed materials on the surface of metal oxide layer 338 on wafer 112 and forms a reactive surface layer or modified material layer with a defined thickness. The modified material layer can be subsequently removed during the removal, or etch, cycle. Any unmodified material, which is not exposed to the radicals of first gas 120 during the surface modification cycle, will not be removed. The modified material can include a gradient in chemical composition and/or physical structure. In some embodiments, the surface modification cycle can have a duration from about 10 s to about 30 s and the modified metal oxide layer can have depth 338d ranging from about 3 Å to about 10 Å (shown in FIG. 4A). However, the surface modification cycle can be shorter or longer, and may depend on the geometry of chamber 102 (e.g., the volume, the distance of shower head 103 from wafer 112, etc.), the pumping speed of the pump stack (not shown in FIG. 1), or other process parameters (e.g., self-limiting behavior of first gas 120, etc.).

In some embodiments, after the surface modification cycle, a transition cycle may be introduced to remove any unreacted quantities of first gas 120 in first gas line 106 and chamber 102. During the transition cycle, the flow of first gas 120 can be stopped by first valve 114 and its partial pressure is reduced as it is pumped out of chamber 102. In some embodiments, the transition cycle can including purging first gas line 106 and chamber 102 with an inert gas, such as helium. In some embodiments, the transition cycle can last from about 30 s to about 60 s. However, the transition cycle can be shorter or longer, and may depend on the geometry of chamber 102 (e.g., the volume, the distance of shower head 103 from wafer 112, etc.), the pumping speed of the pump stack (not shown in FIG. 1), or other process parameters.

Referring to FIG. 7, method 700 continues with operation 720 and the process of removing a top portion of the metal oxide by a ligand exchange reaction. As shown in FIG. 1, first valve 114 can be closed and third valve 118 can open. Vapor 124 of ligand exchange precursor can be delivered to chamber 102. In some embodiments, third plate 132 can connect to second gas line 108 and generate uniformly distributed vapor 124 of ligand exchange precursor in gas region 134. In some embodiments, second valve 116 can open and second gas 122 can be delivered to chamber 102 during the material removal cycle. Second gas 122 can include hydrogen or argon to provide higher energy radicals for the ligand exchange reaction. Plasma generator 110 can generate a plasma of second gas 122 and form plasma region 128 between first plate 126 and second plate 130. Plasma region 128 can include ions and radicals of the plasma of second gas 122. In some embodiments, second plate 130 can be electrically connected to a ground acting as a discharger. Second plate 130 can neutralize ions and form radicals with higher kinetic energies than radicals generated in plasma region 128. Higher kinetic energies radicals can accelerate the ligand exchange reaction and increase the etching rate of metal oxide layer 338. In some embodiments, the material removal cycle can be performed at a temperature ranging from about 250° C. to about 300° C. The material removal cycle can remove a top portion of modified materials on wafer 112, for example, fluorinated metal oxide on the surface of metal oxide layer 338 with a depth 338$d$ as shown in FIG. 4A. In some embodiments, depth 338$d$ can range from about 3 A to about 10 A. In some embodiments, after the material removal cycle, another transition cycle as described above may be performed to remove any unreacted quantities of ligand exchange precursor in chamber 102.

Referring to FIG. 7, method 700 continues with operation 730 and the process of cleaning the surface of the metal oxide with a plasma of a second gas. As shown in FIG. 1, first valve 114 and third valve 118 can be closed and second valve 116 can open. Second gas 122 can be delivered to chamber 102. In some embodiments, second gas 122 can include a surface cleaning gas, such as hydrogen. In some embodiments, second gas 122 can include a plasma of the surface cleaning gas generated from a remote plasma generator (not shown). First plate 126 can distribute second gas 122 uniformly over wafer 112. Plasma generator 110 can generate a plasma of second gas 122 and form plasma region 128 between first plate 126 and second plate 130. Plasma region 128 can include ions and radicals of the plasma of second gas 122. In some embodiments, second plate 130 can be biased at a negative voltage ranging from about −1 Volt to about −500 Volts to filter out ions. Radicals of second gas 122 in plasma region 128 can pass through second plate 130 and clean the surface of metal oxide layer 338 on wafer 112. The surface cleaning cycle can reset the surface of metal oxide layer 338 to a near-pristine state for the next etching cycle of plasma-assisted thermal ALE.

Figure 8B:
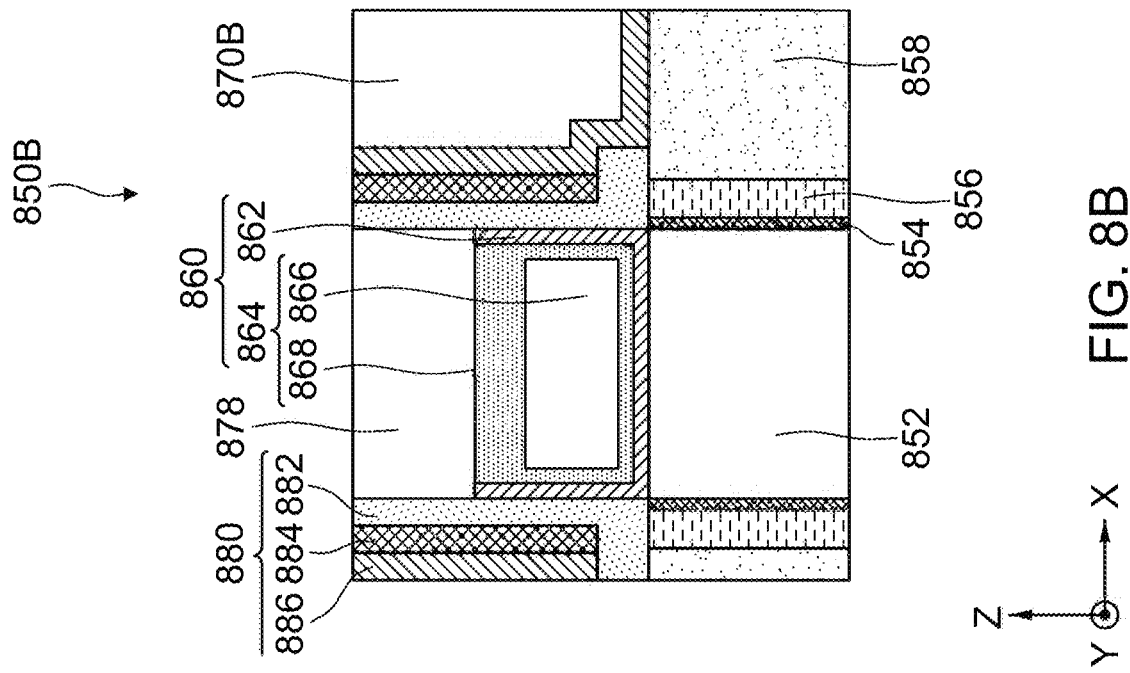
FIGS. 8A and 8B illustrates exemplary semiconductor devices with metal oxides, in accordance with some embodiments.
Figure 8A:
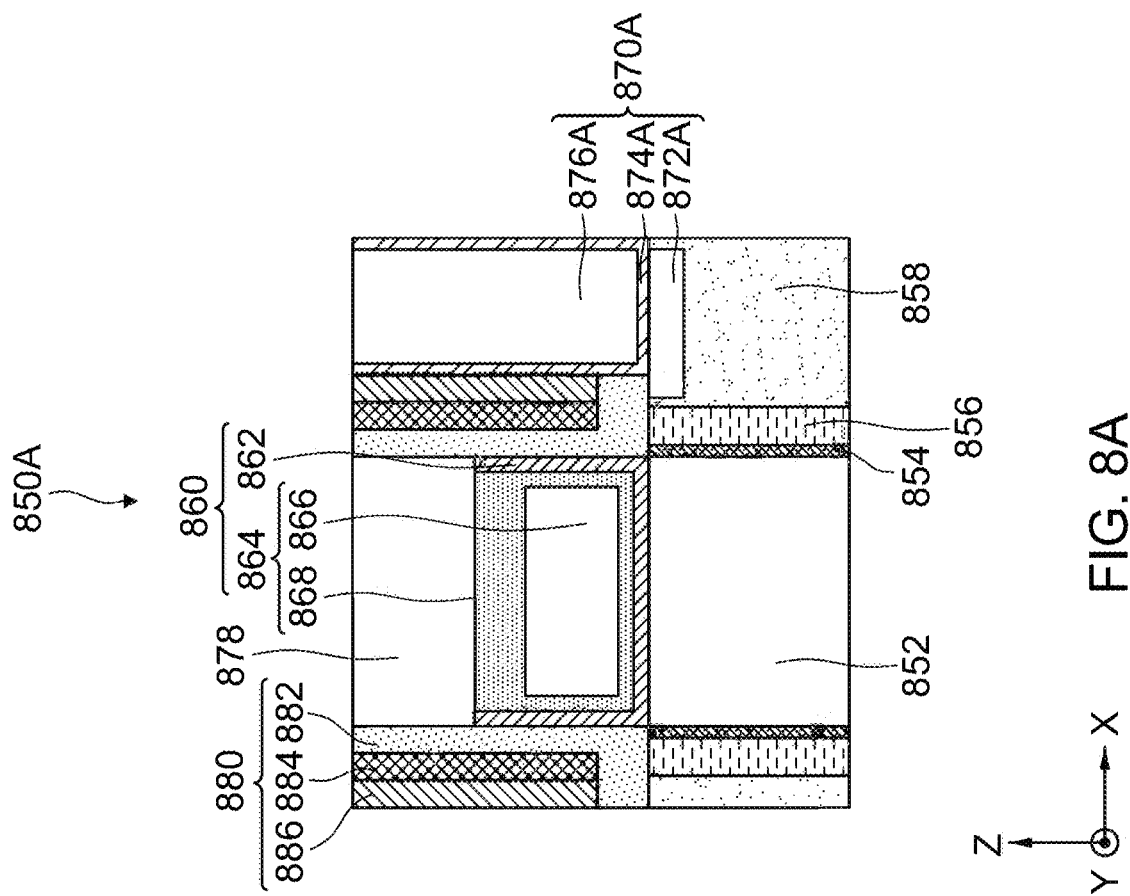

FIGS. 8A and 8B illustrate exemplary semiconductor devices 850A and 850B respectively with metal oxides 884, in accordance with some embodiments. Semiconductor devices 850A and 850B can include planar metal oxide semiconductor field-effect transistors (MOSFETs) or fin field effect transistors (finFETs). As shown in FIGS. 8A and 8B, semiconductor devices 850A and 850B can both include fin structures 852, dielectric liners 854, dielectric layers 856, source/drain (S/D) epitaxial structures 858, gate structures 860, and capping structures 878. Gate structures 860 can include gate dielectric layers 862 and gate electrodes 864. Gate electrodes 864 can include work function layers 866 and metal fills 868. In some embodiments, semiconductor device 850A can include an S/D contact structure 870A connecting to S/D epitaxial structure 858, as shown in FIG. 8A. S/D contact structure 870A can include a silicide layer 872A, a metal liner 874A, and a metal contact 876A. In some embodiments, semiconductor device 850B can include a dielectric plug 840B on top of S/D epitaxial structure 858 and S/D epitaxial structure 858 may not be connected to an S/D contact structure, as shown in FIG. 8B.

Semiconductor devices 850A and 850B can further include gate spacers 880. Gate spacers 880 can include first dielectric layers 882, sacrificial dielectric layers 884, and second dielectric layers 886. First dielectric layers 882 can include a dielectric material, such as silicon oxide, silicon nitride, a low-k material, and a combination thereof. The term "low-k" can refer to a small dielectric constant. In the field of semiconductor device structures and manufacturing processes, low-k can refer to a dielectric constant that is less than the dielectric constant of silicon oxide (e.g., less than about 3.9). Sacrificial dielectric layers 884 can include a metal oxide, such as aluminum oxide. Second dielectric layers 886 can include a dielectric material similar to first dielectric layers 882.

Figure 9A:
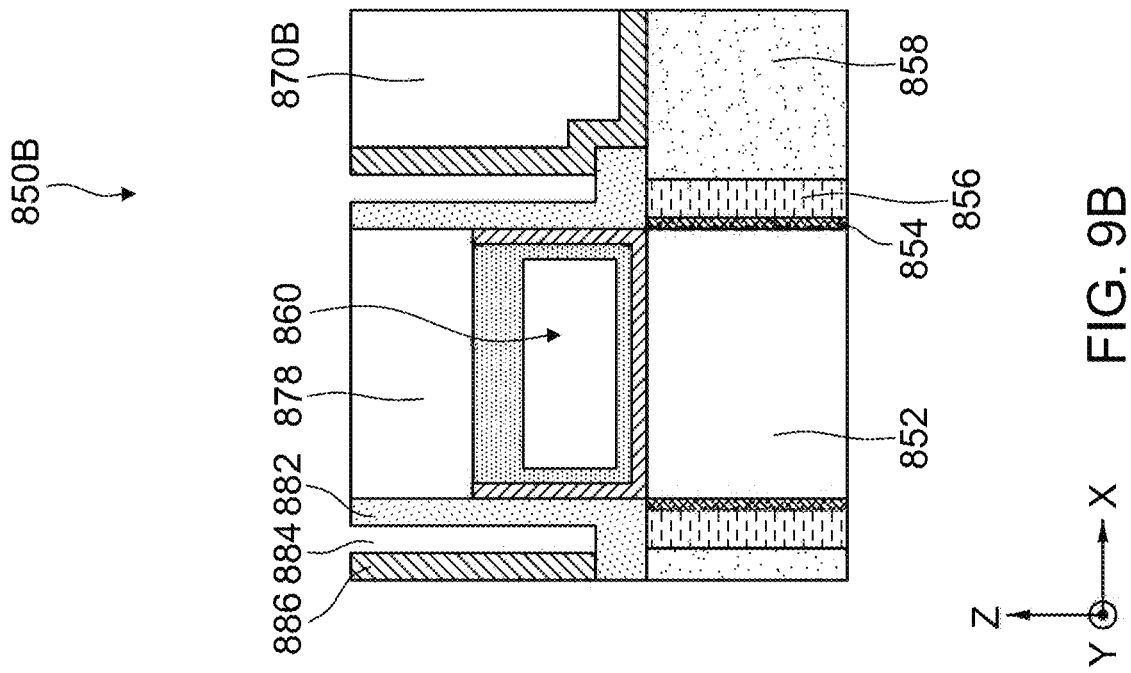
FIGS. 9A and 9B illustrates exemplary semiconductor devices with metal oxides after a plasma-assisted thermal ALE process, in accordance with some embodiments.
Figure 9B:
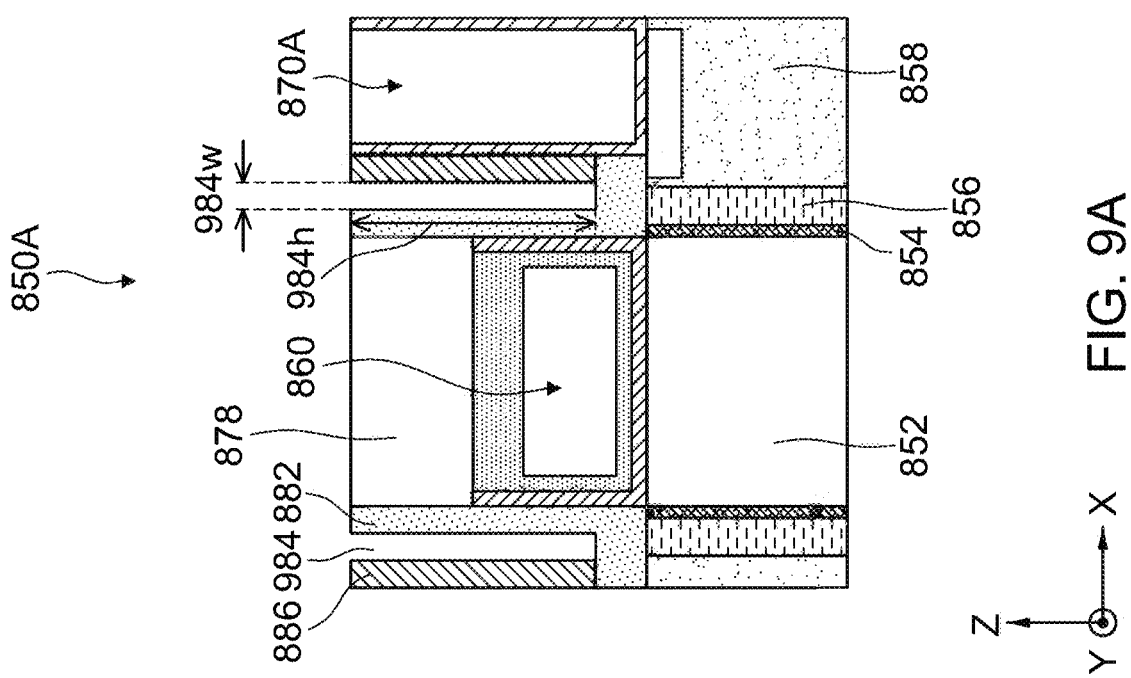

In some embodiments, the plasma-assisted thermal ALE process described above (e.g., method 700 of FIG. 7) can remove sacrificial dielectric layers 884 using exemplary plasma-assisted thermal ALE system 100, 200, or 300 shown in FIGS. 1, 2, 3A, and 3B respectively. After the plasma-assisted thermal ALE process, sacrificial dielectric layers 884 can be removed and openings 984 can be formed between first dielectric layers 882 and second dielectric layers 886, as shown in FIGS. 9A and 9B. In some embodiments, the plasma-assisted thermal ALE process can increase the etch rate of the metal oxide in sacrificial dielectric layers 886 while maintaining etch selectivity between sacrificial dielectric layers 886 and adjacent first and second dielectric layers 882 and 886. For example, the etch rate of sacrificial dielectric layers 886 can range from about 5 Å/cycle to about 10 Å/cycle. In some embodiments, after removing sacrificial dielectric layers 884 with the plasma-assisted thermal ALE process, openings 984 can have a horizontal dimension 984$w$ (e.g., width) along an X-axis ranging from about 1 nm to about 4 nm and a vertical dimension 984$h$ (e.g., height) along a Z-axis ranging from about 8 nm to about 16 nm. In some embodiments, a ratio of vertical dimension 984$h$ to horizontal dimension 984$w$ can range from about 2 to about 16.

In some embodiments, the removal of sacrificial dielectric layers 884 can be followed by formation of sealing structures to seal openings 984 and form air spacers (not shown) between gate structures 860 and adjacent structures (e.g., S/D contact structures 870A), which can reduce parasitic capacitance and improve device performance of semiconductor devices 850A and 850B.

Various embodiments of the present disclosure provide an exemplary plasma-assisted thermal atomic layer etching (ALE) process. In some embodiments, the plasma-assisted thermal ALE process can increase an etch rate of metal oxide layer 338 while maintaining etch selectivity between metal oxide layer 338 and adjacent materials on wafer 112. A plasma-assisted thermal ALE process can include three sequential reaction cycles: (i) a surface modification cycle, (ii) a material removal cycle, and (iii) a surface cleaning cycle. In some embodiments, the plasma-assisted thermal ALE process can modify the surface of metal oxide layer 338 with radicals from a plasma during the surface modification cycle. The material removal cycle can include a ligand exchange reaction, which can be performed under a thermal condition. In some embodiments, radicals of a plasma can increase the ligand exchange kinetic energy and the speed of the ligand exchange reaction, thus increasing removal of the modified surface of metal oxide layer 338 and the etching rate of the metal oxide layer 338. In some embodiments, plates 126, 130, and 132 with evenly distributed openings or nozzles can distribute the plasmas and the gases uniformly across the wafer. In some embodiments, a plasma flush of radicals during the surface cleaning cycle can remove surface ligand residues and byproducts and create a fresh surface for the next etching cycle. The plasma flush can further increase the etching rate of the plasma-assisted thermal ALE process.

In some embodiments, a method for plasma-assisted etching of a metal oxide includes modifying a surface of the metal oxide with a first gas, removing a top portion of the metal oxide by a ligand exchange reaction, and cleaning the surface of the metal oxide with a second gas.

In some embodiments, a system for plasma-assisted etching of a metal oxide includes a wafer holder configured to hold a wafer with the metal oxide in a chamber, a first gas line connected to the chamber and configured to deliver a first gas and a second gas to the chamber, a second gas line connected to the chamber and configured to deliver a precursor to the chamber for a ligand exchange reaction on the metal oxide, and a plasma generator connected to the wafer holder and configured to generate a plasma of the first gas to modify a surface of the metal oxide and a plasma of the second gas to clean the surface of the metal oxide.

In some embodiments, a system for plasma-assisted etching of a metal oxide includes a chamber, a first gas line, and a second gas line. The chamber include a wafer holder configured to hold a wafer with the metal oxide and a plasma generator connected to the wafer holder and configured to generate a plasma from a first gas to modify the surface of the metal oxide and a second gas to clean the surface of the metal oxide. The first gas line is connected to the chamber and configured to deliver the first gas to the wafer. The second gas line is connected to the chamber and configured to deliver the second gas to the wafer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a wafer having a metal oxide, wherein the wafer is held by a wafer holder in a chamber;
    delivering a gas to the chamber via a first gas line connected to the chamber;
    generating a plasma of the gas with a plasma generator in the chamber;
    generating radicals from the plasma of the gas with a plate in the chamber; and
    delivering, via a second gas line connected to the chamber, a precursor to the wafer for a ligand exchange reaction on the metal oxide, wherein the radicals accelerate the ligand exchange reaction.

2. The method of claim 1, further comprising distributing the plasma of the gas across the chamber with an additional plate between the wafer and the plate.

3. The method of claim 1, further comprising distributing the precursor across the wafer with an additional plate between the plate and the wafer.

4. The method of claim 1, further comprising heating the wafer with a heating system connected to the wafer holder for the ligand exchange reaction.

5. The method of claim 1, further comprising vaporizing the precursor with a vaporizer connected to the second gas line.

6. The method of claim 1, further comprising activating the ligand exchange reaction on the metal oxide with the precursor under a thermal condition.

7. The method of claim 1, further comprising:
    delivering an additional gas to the chamber via the first gas line;
    generating an additional plasma of the additional gas with the plasma generator; and
    cleaning a surface of the metal oxide with the additional plasma after the ligand exchange reaction.

8. The method of claim 7, wherein the cleaning of the surface of the metal oxide comprises:
    generating additional radicals from the additional plasma of the additional gas with the plate; and
    cleaning the surface of the metal oxide with the additional radicals.

9. The method of claim 1, wherein the metal oxide comprises hafnium oxide, aluminum oxide, or zirconium oxide.

10. A method, comprising:
    distributing, with a first plate, a first gas across a surface of a metal oxide on a wafer in a chamber;
    generating, with a second plate, first radicals from a plasma of the first gas;
    modifying the surface of the metal oxide with the first radicals;
    distributing, with the first plate, a second gas across the surface of the metal oxide;
    generating, with the second plate, second radicals from the second gas; and
    accelerating a ligand exchange reaction on the surface of the metal oxide with the second radicals.

11. The method of claim 10, further comprising:
    vaporizing a precursor with a vaporizer connected to the chamber;
    distributing, with a third plate, the vaporized precursor across the surface of the metal oxide; and
    activating the ligand exchange reaction with the precursor.

12. The method of claim 10, further comprising heating the wafer with a heating system for the ligand exchange reaction.

13. The method of claim 10, further comprising:
    delivering a third gas to the chamber;
    generating third radicals from a plasma of the third gas with the second plate; and cleaning the surface of the metal oxide with the third radicals after the ligand exchange reaction.

14. The method of claim 10, further comprising activating the ligand exchange reaction on the metal oxide with a precursor under a thermal condition.

15. The method of claim 10, further comprising removing a top portion of the metal oxide with the ligand exchange reaction.

16. A method, comprising:
   distributing, with a first plate, a gas across a surface of a metal oxide on a wafer in a chamber;
   generating, with a second plate, radicals from a plasma of the gas;
   modifying the surface of the metal oxide with the radicals;
   distributing, with a third plate, a precursor across the surface of the metal oxide; and
   removing a top portion of the metal oxide by the precursor with a ligand exchange reaction.

17. The method of claim 16, further comprising:
   vaporizing the precursor with a vaporizer connected to the chamber; and
   activating the ligand exchange reaction with the vaporized precursor under a thermal condition.

18. The method of claim 16, further comprising heating the wafer with a heating system for the ligand exchange reaction.

19. The method of claim 16, further comprising:
   delivering an additional gas to the chamber;
   generating additional radicals from a plasma of the additional gas with the second plate; and
   cleaning the surface of the metal oxide with the additional radicals after the ligand exchange reaction.

20. The method of claim 16, further comprising:
   delivering an additional gas to the chamber;
   generating additional radicals from a plasma of the additional gas with the second plate; and
   accelerating the ligand exchange reaction with the additional radicals.

* * * * *